(12) United States Patent
Koc et al.

(10) Patent No.: US 11,336,208 B2
(45) Date of Patent: May 17, 2022

(54) ACTUATOR

(71) Applicant: Physik Instrumente (PI) GmbH & Co. KG, Karlsruhe (DE)

(72) Inventors: Burhanettin Koc, Ettlingen (DE); Bülent Delibas, Weingarten (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 762 days.

(21) Appl. No.: 16/321,212

(22) PCT Filed: Jul. 26, 2017

(86) PCT No.: PCT/EP2017/068898
§ 371 (c)(1),
(2) Date: Jan. 28, 2019

(87) PCT Pub. No.: WO2018/019892
PCT Pub. Date: Feb. 1, 2018

(65) Prior Publication Data
US 2019/0165696 A1    May 30, 2019

(30) Foreign Application Priority Data
Jul. 29, 2016   (EP) .................................... 16182067

(51) Int. Cl.
*H02N 2/00*   (2006.01)
*H01L 41/047*   (2006.01)
(Continued)

(52) U.S. Cl.
CPC ........... *H02N 2/004* (2013.01); *H01L 41/047* (2013.01); *H01L 41/0913* (2013.01); *H02N 2/103* (2013.01); *H01L 41/083* (2013.01)

(58) Field of Classification Search
CPC ........ H02N 2/004; H02N 2/103; H02N 2/026; H01L 41/047; H01L 41/0913; H01L 41/083
See application file for complete search history.

(56) References Cited

U.S. PATENT DOCUMENTS

| 5,453,653 A | 9/1995 | Zumeris |
| 6,081,063 A | 6/2000 | Kasuga et al. |

(Continued)

FOREIGN PATENT DOCUMENTS

| CN | 1534857 A | 10/2004 |
| CN | 101288185 A | 10/2008 |

(Continued)

OTHER PUBLICATIONS

Office Action (Notification of the First Office Action) dated Aug. 28, 2019, by the Chinese Patent Office in corresponding Chinese Patent Application No. 201780046827.8, and an English Translation of the Office Action. (9 pages).

(Continued)

*Primary Examiner* — Emily P Pham
(74) *Attorney, Agent, or Firm* — Buchanan Ingersoll & Rooney PC

(57) ABSTRACT

An actuator with a rectangular shape] is made of polarized electromechanical material having two large main surfaces and at least four side surfaces, two of which being longer than the other two side surfaces. At least one friction element is arranged on at least one of the shorter side surfaces. At least two active electrodes are arranged on one of the main surfaces, with one common electrode arranged on the other of the main surfaces The electromechanical material of the actuator is excitable to perform standing wave deformations due to an electric field generated therein for moving the friction element to drive an element. The actuator aspect ratio for its length to its thickness is between 3.9 and 4.1 and (Continued)

Figure 1:
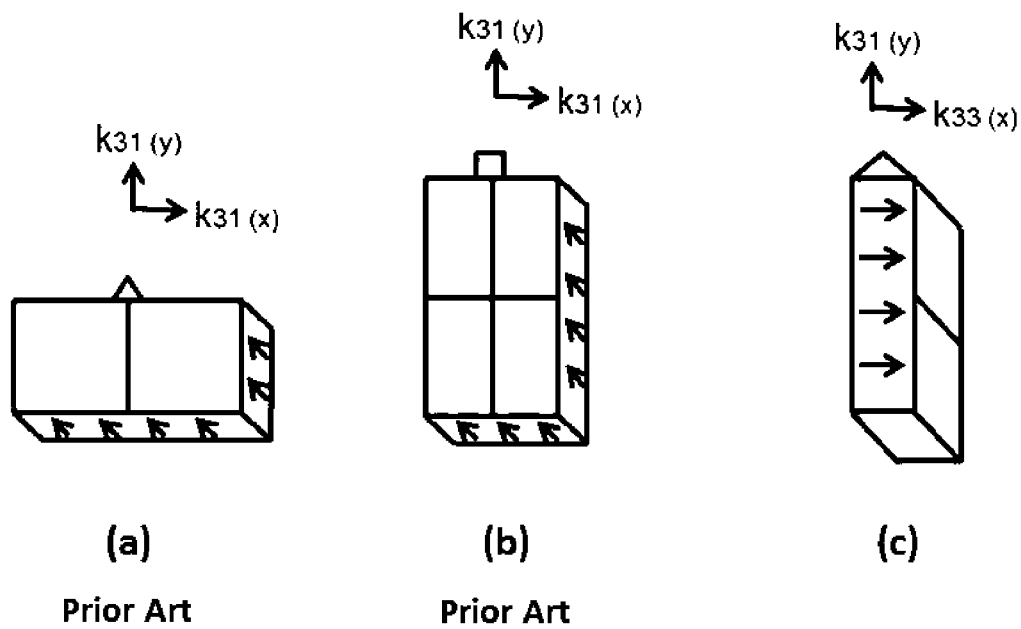

an aspect ratio for the length relative to width is between 2 and 5.

18 Claims, 7 Drawing Sheets

(51) Int. Cl.
    *H02N 2/10* (2006.01)
    *H01L 41/09* (2006.01)
    *H01L 41/083* (2006.01)

(56) References Cited

U.S. PATENT DOCUMENTS

| | | |
|---|---|---|
| 6,384,514 B1 | 5/2002 | Slutskiy et al. |
| 7,109,639 B2 | 9/2006 | Yamamoto et al. |
| 7,187,104 B2 | 3/2007 | Yamamoto et al. |
| 7,564,173 B2 | 7/2009 | Namerikawa et al. |
| 7,576,474 B2 | 8/2009 | Koc et al. |
| 7,598,656 B2 | 10/2009 | Wischnewskij et al. |
| 7,635,940 B2 | 12/2009 | Ue et al. |
| 7,764,449 B2 | 7/2010 | Koc et al. |
| 7,932,661 B2 | 4/2011 | Ando et al. |
| 7,937,661 B2 | 5/2011 | Hooker |
| 8,350,446 B2 | 1/2013 | Adachi et al. |
| 8,604,665 B2 | 12/2013 | Wischnewskij et al. |
| 2005/0242686 A1 | 11/2005 | Yamamoto et al. |
| 2008/0073999 A1 | 3/2008 | Wischnewskij et al. |
| 2010/0013353 A1 | 1/2010 | Wischnewskij et al. |
| 2010/0320869 A1 | 12/2010 | Li et al. |
| 2017/0126147 A1* | 5/2017 | Wischnewskiy ....... H02N 2/026 |

FOREIGN PATENT DOCUMENTS

| | | |
|---|---|---|
| DE | 102013203836 A1 | 9/2014 |
| SU | 693493 A1 | 10/1979 |

OTHER PUBLICATIONS

International Search Report (PCT/ISA/210) dated Nov. 8, 2017, by the European Patent Office as the International Searching Authority for International Application No. PCT/EP2017/068898.

Written Opinion (PCT/ISA/237) dated Nov. 8, 2017, by the European Patent Office as the International Searching Authority for International Application No. PCT/EP2017/068898.

\* cited by examiner

ACTUATOR

The invention relates to an actuator according to claim 1 and a method to drive such an actuator according to claim 10.

Precise positioners in the order of several tenths of nanometer resolutions are in demand for medical and biological research such as in microscope stages and micro assembly units. Requirements from these positioners are not only obtaining a motion at high precision, but also to obtain a very wide range of moving speeds from 100 nanometers to one meter per second. The most obvious solution to meet said requirements is the usage of a hybrid positioner with two types of different positioners where one of them is for coarse motion and the other is for precise motion. However, availability of space and requirement of many wires for electrical driving of actuators in moving stages make such systems to be complex and costly. A linear motor with a wide range of moving speed and a capability to make motion steps in the order of several tenths of nanometers could be useful for industrial and assembly technologies.

The documents U.S. Pat. Nos. 6,081,063 and 7,764,449, for example, describe resonance type piezoelectric motors using multi-mode excitation of a rectangular piezoelectric prism. Commonly used modes on vibrating elements in these motors are first longitudinal mode and second bending mode. Sometimes, the first longitudinal mode and the fourth bending mode are used. Regardless of the actuator type, i.e. bulk or multilayer type, metallization on the rectangular piezoelectric prism element in order to provide electrodes for excitation of the piezoelectric material divides the volume of the actuator, for example, into four smaller rectangular prism elements. When an electrical driving signal drives a pair of diagonally opposite arranged small prisms at the same time, and due to a certain aspect ratio of length and width (or thickness) of the actuator, first longitudinal and second bending mode either in thickness or in width direction are excited at the same time causing points at the side surfaces of the actuator to generate elliptical motion that is transferred to an element to be moved through frictional interaction.

In case the excited second bending mode is in thickness direction, the actuator contains at least two piezoelectric layers. An electrode between said two piezoelectric layers covers the whole surface of each adjacent piezoelectric layer and is used as the common electrode. Electrodes on the outer surfaces are divided into two sections; in other words, two half electrodes are arranged on both outer surfaces. When a positive side of a sinusoidal signal is applied to two diagonally arranged half electrodes and a negative side of the sinusoidal signal is applied to the middle common electrode, two diagonally arranged volumes of the actuator are electrically driven. When thickness and length of the bilayer plate is selected with a certain aspect ratio in a close tolerance, said driving signal can excite the first longitudinal mode and the second bending mode at the same time.

However, the process of making piezoelectric element in such multilayer form has some disadvantages. First, the layers have to be symmetric to the middle of the plate in thickness direction, which requires a tight tolerance for surface polishing processes. Second, internal electrodes in one quarter need to be combined to the other quarter, which is diagonally in opposite sides. Therefore, production of such types of multilayer actuators that are, for example, described in documents U.S. Pat. Nos. 7,576,474, 7,635,940, 7,564,173, 7,932,661 and 8,350,446, is costly.

The documents SU 693 493 and U.S. Pat. No. 5,453,653, for example, teach actuators where the excited bending mode is in its width direction. Here, the actuator contains only one piezoelectric material layer. Four electrodes are arranged on one of the main surfaces with two pairs of diagonally arranged and coupled electrodes. The other main surface is uniformly metallized and contains only one electrode. While each pair of the diagonally arranged and coupled electrodes act as an active terminal, the uniform electrode acts as the common terminal. When an electrical signal is applied in between one active terminal and the common terminal, the first longitudinal mode and the second bending mode in width direction are excited due to a defined length to width ratio of the actuator dimensions.

Piezoelectric motors with actuators operating according to the above described operating principals have the feature of low speed at high torque without a need of gear mechanisms. These motors also have the advantage of wider operating speed compared to inertia and piezo-walk drive type piezoelectric motors. However, the driving voltage speed nonlinearity causes some limitations when using such kind of resonance piezoelectric motors for nano-positioning applications.

In general, speed of a resonance drive type piezoelectric motor is controlled by the magnitude of the driving voltage. In order to have a motor to make small steps, a natural way is to decrease magnitude of the driving voltage. When the magnitude of the driving voltage is decreased below a certain value, the same small driving voltage cannot always make the same small steps due to nonlinearity effects of the friction contact. Occasionally, the small driving voltage does not lead to a driving step at all. To overcome said problem, document U.S. Pat. No. 7,937,661 proposes a resonance motor with a modified electrode configuration of an actuator for generating first longitudinal mode and second bending mode. In this motor, motions in normal and tangential directions are independently controlled. However, the multilayer actuator element has relatively complex internal metallization or electrode structure, respectively, such that the internal conductive electrodes need to be combined or connected using many number of side electrodes. Additionally, the side electrodes need to be combined or connected to termination electrodes on which a flexible printed circuit board (FPCB) or wires are attached. Often, side electrodes have to be combined or connected to termination electrodes after multiple poling treatment processes. Therefore, manufacturing costs for the motor according to the U.S. Pat. No. 7,937,661 are relatively high.

A resonance piezoelectric motor using an actuator realized by a rectangular type piezoelectric plate with a certain length to width ratio is also known from document U.S. Pat. No. 7,598,656. While one of the main surfaces of the actuator has metallization electrode covering one of the largest surface, the electrodes on the other surface of the plate are segmented into two sections in width direction and a friction tip is attached at the middle of one side surface. When one half of the plate is driven with an electrical signal, a planar mode is excited. The friction tip and the unexcited other half of the plate function like a perturbation mass. As a result, an oblique motion at the end of the friction tip causes the sliding element to be moved for obtaining a linear or rotary motion. Even though this motor has an excellent performance such as a moving speed of up to 0.5 m/s and a simple electrode structure, due to the operating mode, a high stress concentration at the attached boundary of the friction tip limits the electric fields to be increased further for obtaining even higher moving speeds.

Therefore, the objective of the invention is to provide an actuator with a bulk or a multilayer structure having a simple electrode structure which can be produced with a simple and a cost saving manufacturing process.

The aforesaid objective is solved by an actuator according to claim 1, with the corresponding subclaims defining at least appropriate developments.

An actuator according to the invention has a rectangular shape and comprises a polarized electromechanical material. The actuator has two larger main surfaces and four smaller side surfaces connecting the main surfaces with each other, each of the main surfaces having a considerably larger surface area than any of the side surfaces Two of said side surfaces being longer than the other two side surfaces, resulting in two long side surfaces and two short side surfaces, wherein at least one friction element is arranged on at least one of the short side surfaces. Furthermore, the actuator has a length L, a thickness T and a width W, with L corresponding to the longest geometrical extension of the actuator and with the thickness being defined by the normal distance between the main surfaces. At least two active electrodes are arranged on one of the main surfaces, and one common electrode is arranged on the other of the main surfaces, with the electrodes arranged on the main surfaces defining outer electrodes. The electromechanical material of the actuator arranged between the electrodes is polarized such that the polarization direction or the direction of the polarization vectors, respectively, is along the thickness direction of the actuator and directed substantially normal to the main surfaces.

The electromechanical material of the actuator is excitable to perform standing wave deformations due to an electric field generated therein by the application of suitable electric voltages or signals to the electrodes, said deformations leading to a corresponding movement of the friction element attached to the actuator, and said movement of the friction element being usable to drive an element to be driven via friction contact between the friction element and the element to be driven.

The inventive actuator is characterized by an aspect ratio of between 3.9 and 4.1 as regards the length L of the actuator to its thickness T and by an aspect ratio of between 2 and 5 as regards the length L of the actuator to its width W. In other words, the actuator is characterized by the specific geometric ratios $L/T=3.9$ to 4.1 and by $L/W=2$ to 5. Said aspect ratios being suitable for the excitation of a first standing wave causing a first longitudinal vibration mode in length direction of the actuator and to the excitation of a second standing wave causing a second bending mode in thickness direction of the actuator, with the second bending mode vibration perturbing the first longitudinal mode resulting in an elliptic trajectory of the movement of the friction element, said elliptic trajectory of the movement of the friction element being usable to drive an element to be driven in the thickness direction of the actuator.

For example, the friction element can have the shape of a pyramid, a roof, a sphere or a half-sphere. However, it is also possible to provide a friction layer as friction element.

It may prove useful that at least one of the electrodes has a curved section.

Furthermore, it may prove useful that the polarization direction of the electromechanical material is uniform and independent from the position within the electromechanical material.

Moreover, it may prove useful that the actuator is free of electrodes arranged inside the electromechanical material of the actuator.

In addition, it may prove useful that the actuator comprises at least one electrode arranged inside the electromechanical material of the actuator defining an inner electrode.

Here, it may be appropriate that the actuator comprises a multitude of inner electrodes stacked in the thickness direction of the actuator with electrodes being adjacent to each other with respect to the stacking direction having a different size.

It may be appropriate when the outer electrodes are electrically connected to the at least one inner electrode via at least one side electrode arranged on a side surface of the actuator.

It may be also appropriate when each of the outer electrodes is at least partially covered by a layer of an elastic material, and in particular by a non-piezoelectric elastic layer. Especially in cases where the actuator has a larger length to thickness aspect ratio L/T, the longitudinal mode resonance frequency is not close enough to the bending mode resonance frequency such that the intended magnitude of disturbance of the first longitudinal mode might be weak. By the application of said layers of an elastic material, the stiffness in thickness direction of the actuator is increased, and as a consequence the second bending mode resonance frequency is increased as well. At a certain thickness of the elastic layer, the resonance frequency of the longitudinal mode is close enough to the resonance frequency of the bending mode such that the first longitudinal mode could be sufficiently perturbed such that the intended elliptic trajectory of the movement of the friction element reliably results.

Here, it may be appropriate when the length of at least one of the layers of an elastic material is longer than the length of the actuator.

The invention relates in addition to a method for driving the actuator described in the preceding paragraphs in order to excite a first standing wave causing a first longitudinal vibration mode in length direction of the actuator and in order to excite a second standing wave causing a second bending mode in thickness direction of the actuator, with the second bending mode vibration perturbing the first longitudinal mode resulting in an elliptic trajectory of the movement of the friction element. Said method being characterized in applying only one of the active electrodes with an electric voltage, while the at least one other active electrode is floating.

It can be advantageous that the common electrode is applied with an electric voltage that is equal to the electric voltage applied to the active electrode but having a different polarity.

Furthermore it can be advantageous that the electric voltage applied to the active electrode is shifted in its phase to the phase of the electric voltage applied to the common electrode, and with said phase difference being a control parameter to control the electric field in the excited sections of the actuator.

The invention will now be described with reference to the appended drawings:

FIG. 1: Illustration regarding the coupling coefficient of an actuator according to the prior art (FIGS. 1 (*a*) and (*b*)), and of an actuator according to the invention (FIG. 1 (*c*))

Figure 2:
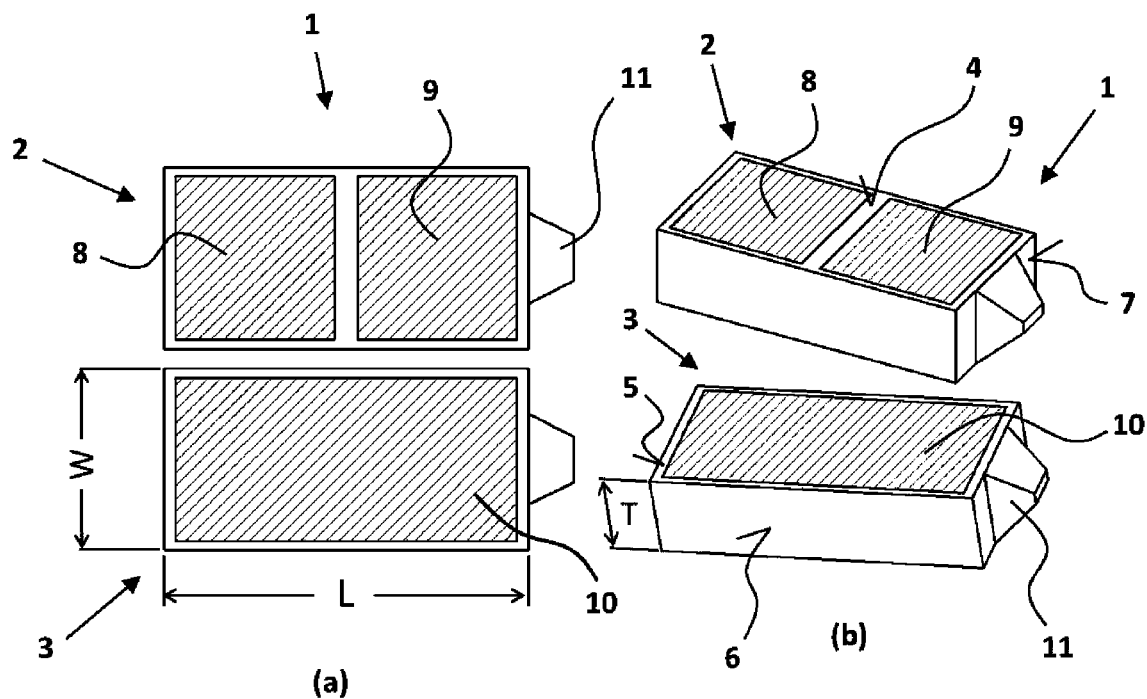
Figure 3:
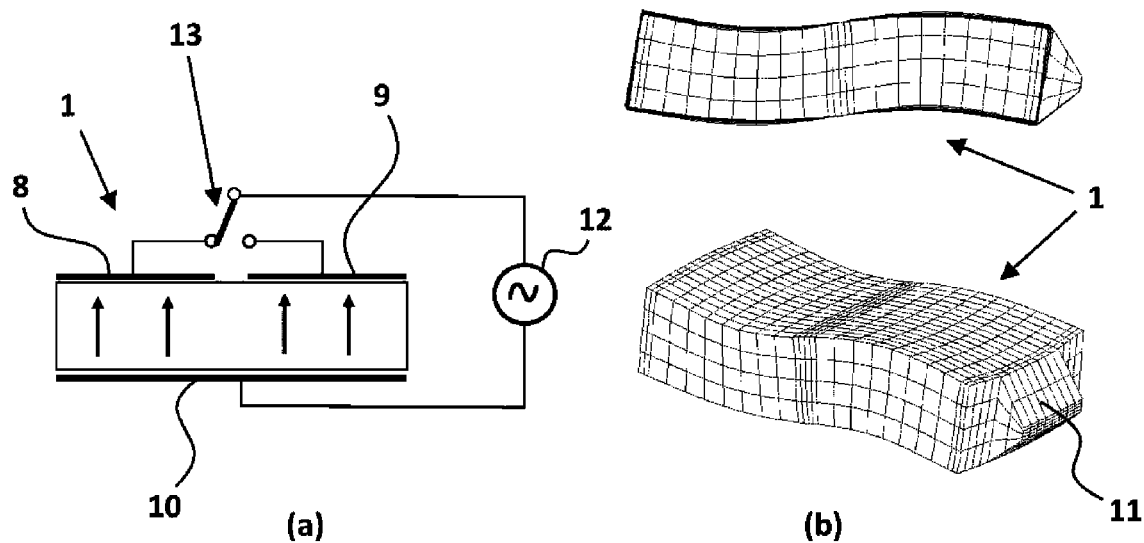
Figure 4:
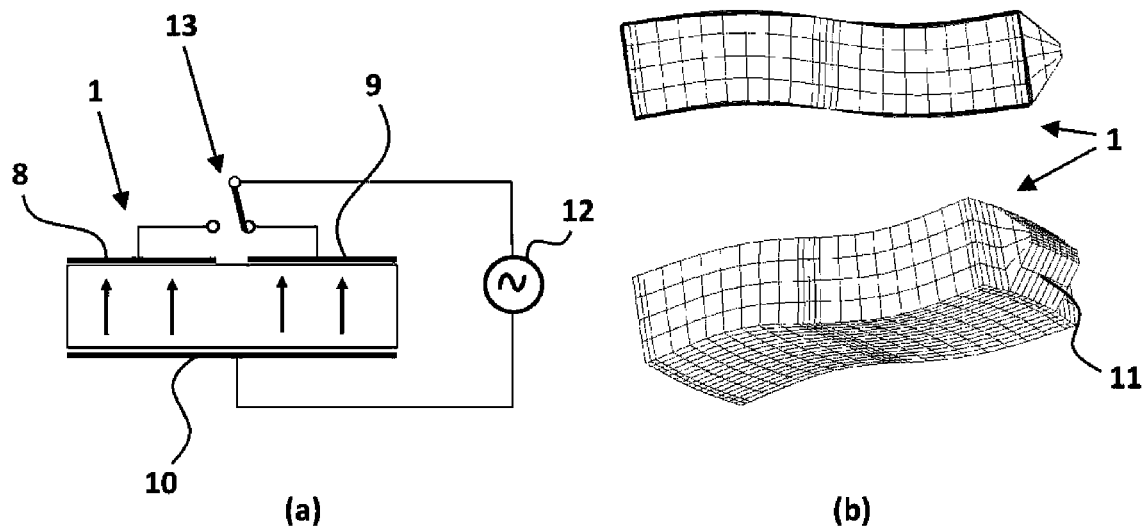
Figure 5:
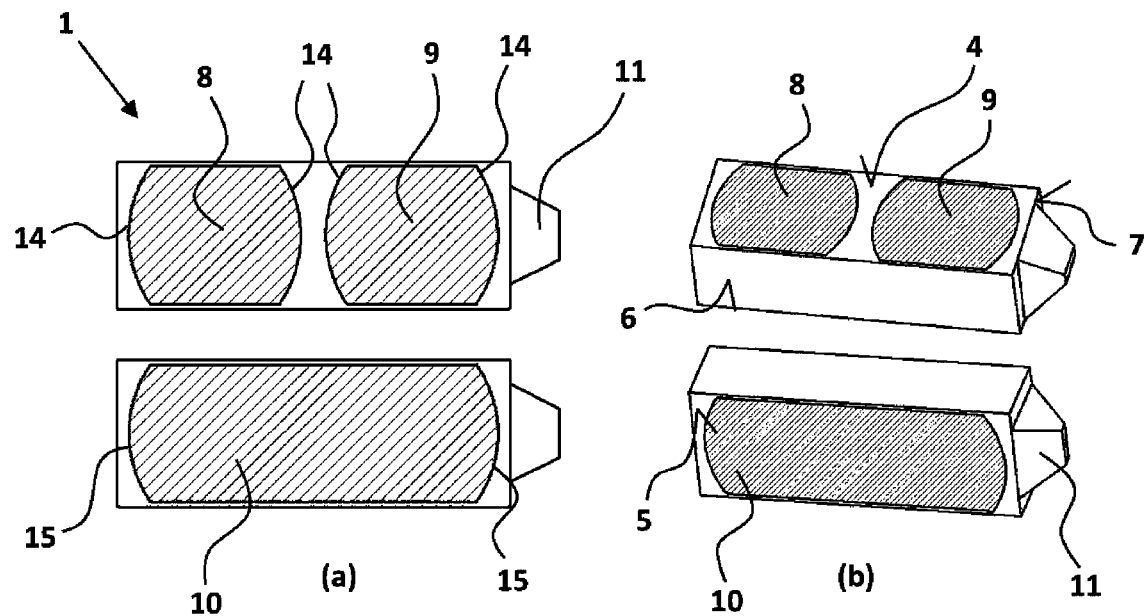
Figure 6:
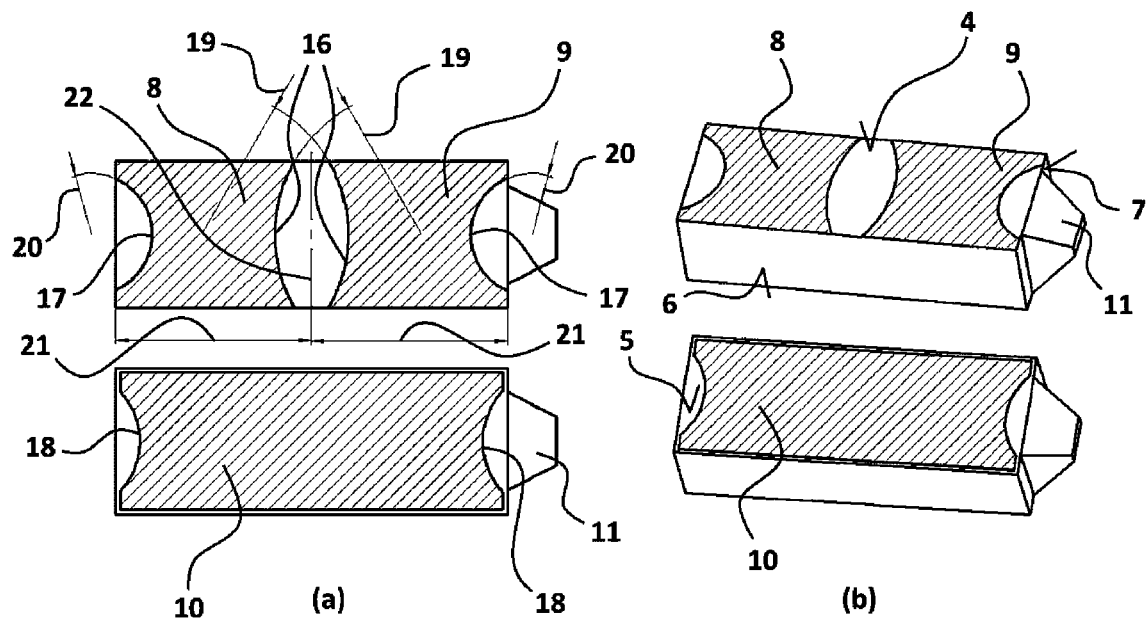

FIG. 2 (*a*): Embodiment of an actuator according to the invention in top view showing top side and bottom side; FIG. 2 (*b*): Actuator according to FIG. 2 (*a*) in a perspective view showing top side and bottom side FIG. 3 (*a*): Block diagram showing a possible electric connection of an inventive actuator with a single voltage signal; FIG. 3 (*b*): Calculated deformation of an inventive actuator excited according to FIG. 3 (*a*) in different views FIG. 4 (*a*): Block diagram showing a possible electric connection of an inventive actuator with a single voltage signal; FIG. 4 (*b*): Calculated deformation of an inventive actuator excited according to FIG. 4 (*a*) in different views FIG. 5 (*a*): Embodiment of an actuator according to the invention in top view showing top side and bottom side; FIG. 5 (*b*): Actuator according to FIG. 5 (*a*) in a perspective view showing top side and bottom side FIG. 6 (*a*): Embodiment of an actuator according to the invention in top view showing top side and bottom side; FIG. 6 (*b*): Actuator according to FIG. 6 (*a*) in a perspective view showing top side and bottom side FIG. 7: Embodiment of an multilayer actuator according to the invention in an exploded view FIG. 8: Embodiment of an actuator according to the invention having two friction elements on opposite side surfaces in different perspective views FIG. 9: Block diagram showing a possible electric connection of an inventive actuator with two voltage signals FIG. 10: Linear drive with two actuators according to the invention FIG. 11: Possible holding/supporting structure for an actuator according to the invention FIG. 1 illustrates in (*a*) and (*b*) the different coupling coefficients of prismatic actuators according to the prior art. Although it is well known that the piezoelectric coupling coefficient in thickness direction ($k_{33}$) is almost two times larger than the coupling coefficient in transverse direction ($k_{31}$), the actuators according to the prior art are driven in $k_{31}$ mode. In a corresponding resonance piezoelectric motor using such actuators, displacement component in tangential direction of the actuator element is responsible for generating a motion. This motion is also responsible for motor speed.

Since the effective coupling coefficient of the inventive actuator is in $k_{33}$ mode which is the dominant mode responsible for generating motion in tangential direction, one can obtain very high velocity at operating resonance frequency. To obtain low velocity or slow motion, respectively, one can shift the actuator operating frequency up to 5 to 10 kHz to higher frequency values, because the dominant tangential motion is generated again by $k_{33}$ mode. Thus, a larger microscopic motion compared to existing actuators and corresponding motors, where motion in tangential direction is controlled by $k_{31}$ mode, is still possible in order to overcome friction coupling and make a very slow motion.

FIG. 2 (*a*) shows a first embodiment of an actuator 1 according to the invention in top views showing top side 2 and bottom side 3, whereas FIG. 2 (*b*) shows the actuator of FIG. 2 (*a*) in two perspective views also showing top side 2 and bottom side 3. The actuator 1 in form of a rectangular, single layer bulk piezoelectric plate has a length L, a width W and a thickness T. The two main surfaces 4 and 5 of the actuator are connected to each other by two longer side surfaces 6 and two shorter side surfaces 7. On the main surface 4 of the top side 2 of the actuator 1, two equally sized active electrodes 8 and 9 serving as active terminals are arranged in juxtaposition and in a spaced manner. On the other main surface 5 of the bottom side 3 of the actuator 1, one common electrode 10 serving as a common terminal covering nearly the corresponding main surface 5 is arranged. A friction element 11 is arranged on one of the shorter side surfaces 7 of the actuator 1.

FIG. 3 (*a*) corresponds to a block diagram showing a possible electric connection of the actuator according to FIG. 2 with a single sinusoidal voltage signal of a single driving source 12. The actuator 1 is electrically excited by using the single driving source 12 in between the active electrode or terminal 8 (the left one in FIG. 3 (*a*)) and the common electrode or terminal 10 simultaneously due to the corresponding position of the switch 13. The driving signal has a frequency corresponding to the actuator's first longitudinal mode resonance frequency. With this driving condition, first longitudinal mode is directly and actively excited. In order to generate an additional bending mode, a length to thickness aspect ratio of about 4 and a length to width aspect ratio of about 2 are selected. Said specific aspect ratios cause the first longitudinal mode to be perturbed by the indirectly generated bending mode, and the resulting microscopic motion or trajectory, respectively, of a point of the friction element 11 is nothing but a narrow ellipse in oblique direction to an element to be driven by the actuator. FIG. 3 (*b*) shows in a side view and in a perspective view the calculated deformations of the actuator when excited by the method as described before.

FIG. 4 (*a*) shows a block diagram for a possible electric connection of the actuator according to FIG. 2 with a single sinusoidal voltage signal of a single driving source 12. The only difference to the block diagram according to FIG. 3 (*a*) is the usage of the other active electrode or terminal 9 (the right one in FIG. 4 (*a*)) due to a corresponding position of the switch 13. In analogy to the excitation method according to FIG. 3, the first longitudinal mode is directly and actively excited, and a bending mode is indirectly excited due to the specific aspect ratios, leading to a microscopic motion or trajectory, respectively, of a point of the friction element 11 is nothing but a narrow ellipse in oblique direction to an element to be driven by the actuator, where the oblique direction is opposite to the oblique direction generated due to an excitation according to FIG. 3 in order to move the element to be driven in the opposite direction. FIG. 4 (*b*) shows in a side view and in a perspective view the calculated deformations of the actuator when excited by the method as described before.

FIGS. 5 (*a*) and 6 (*a*) show different embodiments of an actuator according to the invention in top views showing top side and bottom side, whereas FIGS. 5 (*b*) and 6 (*b*) show the actuator according to FIGS. 5 (*a*) and 6 (*a*), respectively, in perspective views also showing top side and bottom side. The only difference to the actuator shown in FIG. 2 is the shape or geometry of the electrodes. According to FIG. 5 (*a*), each of the active electrodes 8 and 9 arranged on the main surface 4 comprises two oppositely arranged convex sections 14 with one convex section pointing at one of the shorter side surfaces 7 and with the other and oppositely arranged convex section pointing at the other of the shorter side surfaces 7. Beside said convex sections, each active electrode 8, 9 comprises two straight sections arranged in parallel to the longer side surfaces 6, with the straight sections combining the convex portions 14 with each other. The radius and shape of all convex sections 14 is the same, and the shape or geometry of the active electrodes 8 and 9 is identical.

The common electrode 10 arranged on the other main surface 5 also comprises two oppositely arranged convex sections 15 with one convex section pointing at one of the shorter side surfaces 7 and with the other and oppositely arranged convex section pointing at the other of the shorter side surfaces 7. Beside said convex sections, the common electrode 10 comprises two straight sections arranged in parallel to the longer side surfaces 6, with the straight sections combining the convex portions 15 with each other.

The radius and shape of the convex sections 15 is the same, and it is identical to the radius and shape of the convex portions 14.

According to FIG. 6 (*a*), each of the active electrodes 8 and 9 arranged on the main surface 4 has two oppositely arranged concave sections 16 and 17, with one concave section pointing at one of the shorter side surfaces 7 and with the other and oppositely arranged concave section pointing at the other of the shorter side surfaces 7. Beside said concave sections, each active electrode 8, 9 comprises two straight sections arranged in parallel to the longer side surfaces 6, with the straight sections combining the concave sections 16 and 17 with each other.

The concave section 16 has a radius 19, which is bigger than the radius 20 of the concave section 17. The active electrodes 8 and 9 are symmetrically arranged on the main surface 4 with the axis 22 defining a corresponding symmetry axis, arranged at an equal distance 21 from the respective short side surface 7. The active electrodes 8 and 9 have a mirror symmetry with respect to the axis 22. The active electrodes 8 and 9 have the same width as the actuator 1 and thus reach to the longer side surfaces 6.

On the other main surface 5, one common electrode 10 is arranged having two oppositely arranged concave sections 18, with one concave section pointing at one of the shorter side surfaces 7 and with the other and oppositely arranged concave section pointing at the other of the shorter side surfaces 7. The radius of the concave portions 18 is bigger than the radius of the concave portions 17, but smaller than the radius of the concave portions 16. The radius and shape of the concave portions 18 is identical.

Figure 7:
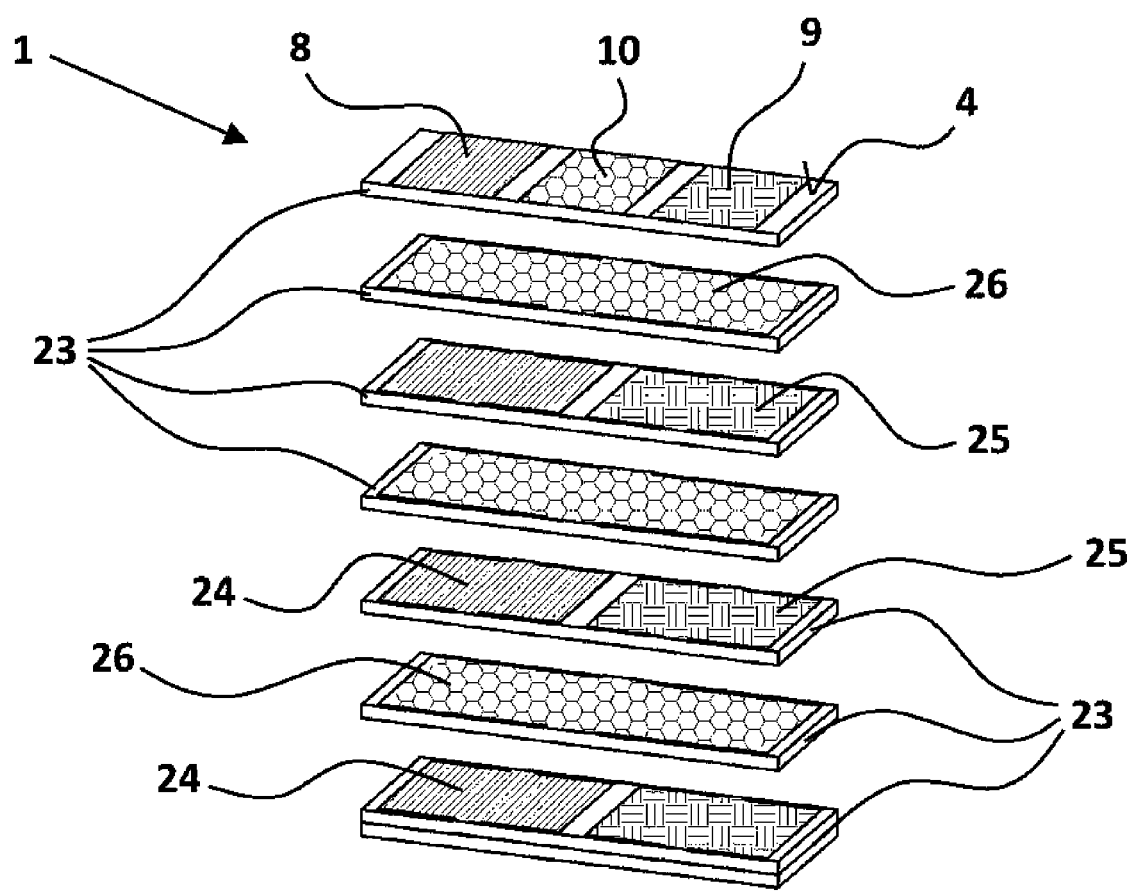

FIG. 7 shows an embodiment of a multilayer actuator according to the invention in an exploded view. Said actuator comprises seven piezoelectric layers 23. Two active electrodes 8 and 9 and one common electrode 10 are arranged on the main surface 4 in a separated and spaced manner with the two active electrodes 8 and 9 arranged at a distal position and surrounding the common electrode 10 which is arranged in the middle.

The two active electrodes 8 and 9 and the one common electrode 10 arranged on the main surface 4 are electrically connected to the corresponding and the same function owning internal electrodes 24 to 26 via side electrodes not shown in FIG. 7, where the internal electrodes 24 and 25 represent active electrodes and with the internal electrodes 26 representing common electrodes.

When an electrical signal is applied in between the common electrode 10 and one of the active electrodes 8 and 9 on the main surface 4, one half of the actuator is electrically activated. Similar to an inventive actuator having a single layer structure as described above, activating the electrodes in one half of the multilayered actuator is enough to excite a perturbed longitudinal mode due to a specific length to thickness and a specific length to width aspect ratio.

Compared to multilayer actuators of multi-mode (i.e. first longitudinal and second bending modes) excitation type piezoelectric resonance motors according to the prior art, the inventive actuator does not need the active internal electrodes to be connected diagonally in opposite direction and the inventive actuator also does not need a symmetry plane at the middle as regards the thickness direction. As a result, the manufacturing process of a multilayer actuator according to the invention is much simpler and more cost-effective.

Figure 8:
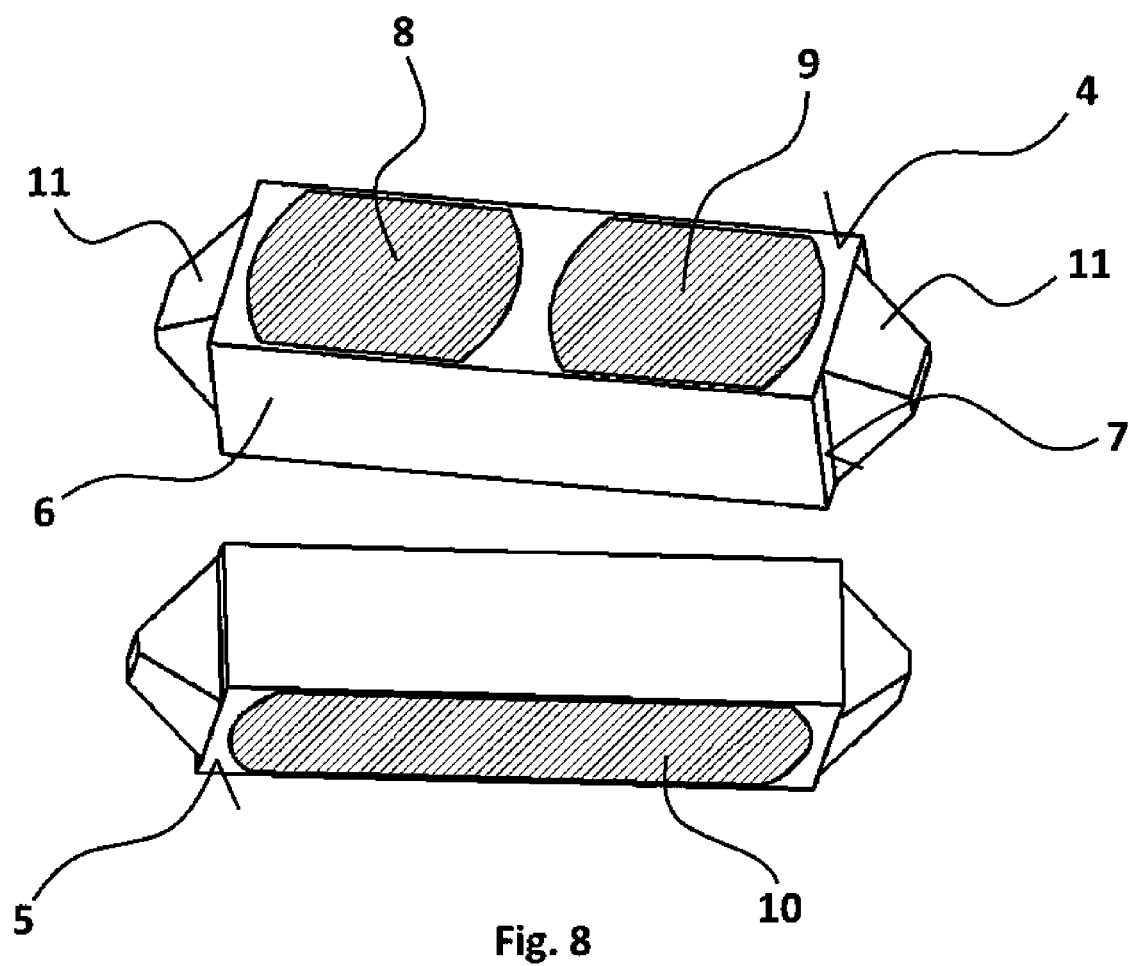

FIG. 8 shows an inventive actuator having an electrode configuration according to the actuator of FIG. 5, but having—in contrast to the actuator according to FIG. 5—two oppositely arranged friction elements 11 with each of the friction elements 11 arranged on a short side surface 7. Such an actuator can, for example, be used in a hollow thin walled cylindrical spinning element to obtain rotary motion. Necessary pre-stressing force could be applied directly by the deformation of the thin-walled cylinder.

Figure 9:
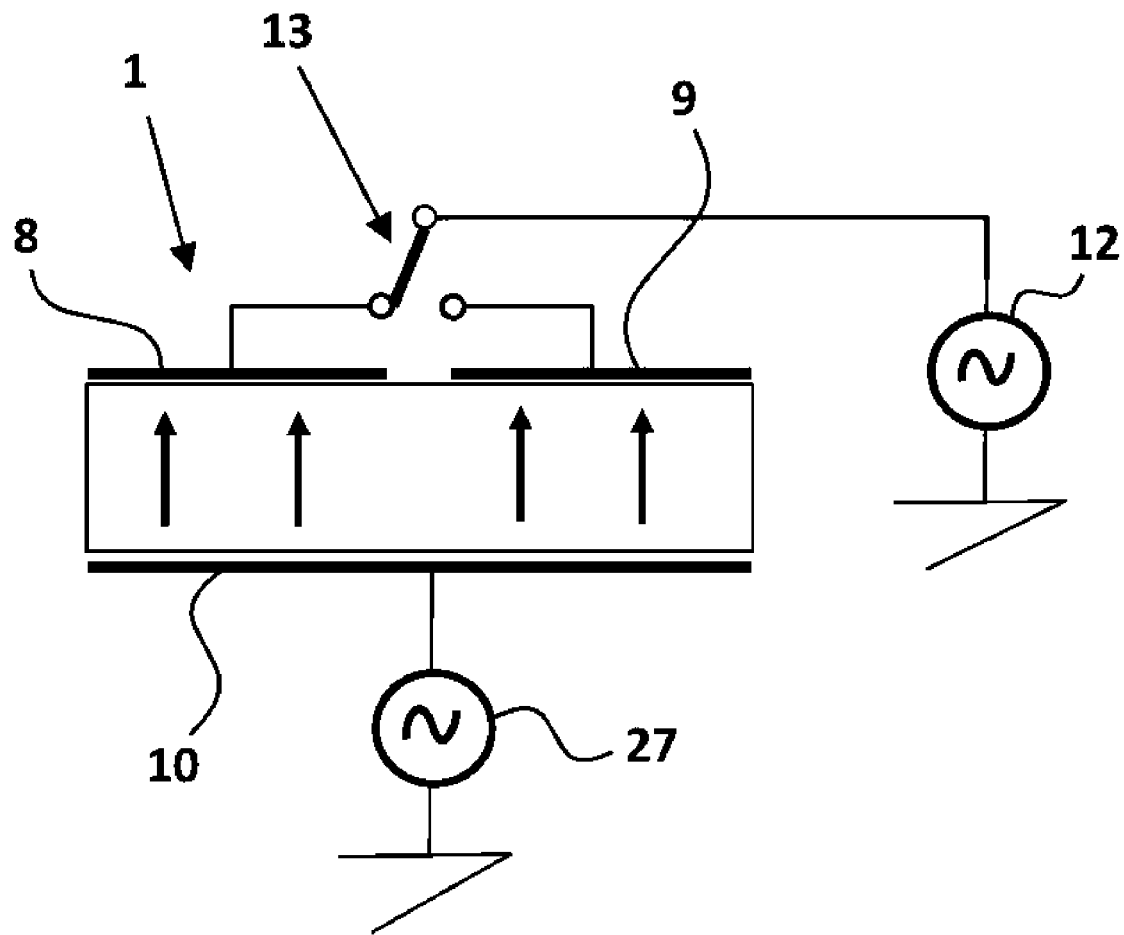

The block diagram according to FIG. 9 shows a possible electric connection of an inventive actuator 1 with two voltage signals, with the corresponding voltage or drive signals having a certain phase difference. A first drive signal generated by the driving source 12 is applied to one of the active electrodes 8 or 9, representing Channel 1 or Ch1, respectively, and the second drive signal generated by the driving source 27, which has a phase difference of $\phi$ compared to the first drive signal, is applied to the common electrode 10. Meanwhile, the corresponding other active electrode 8 or 9 representing Channel 2 or Ch2, respectively, is kept floating. Direction of motion of the element to be driven by the actuator 1 could be altered by changing the drive signal from one active electrode such as Ch1 to the other active electrode Ch2 by the switch 13, while using the same signal at the common electrode 10.

When the trigonometric identity $\sin \alpha \mp \sin \beta = 2 \sin \frac{1}{2}(\alpha \mp \beta) \cos \frac{1}{2}(\alpha \mp \beta)$ is applied to the driving signal, the electric field within the actuator can be calculated as follows: $A/d \sin(\omega t) - A/d \sin(\omega t - \phi) = 2 A/d \sin(\phi/2) \cos(\omega t - \phi/2)$, where A: magnitude of the driving signal, d: thickness of the actuator, $\omega$: frequency of the driving signal, t: time, $\phi$: phase angle of the signal on the common terminal (or phase difference between the two signals).

Assuming that the unit of the driving signals is Volt, while the unit of the piezoelectric thickness d is mm, and while the unit of the phase angle $\phi$ is degrees, respectively, it becomes clear that the magnitude of the electric field is dependent from the phase angle $\phi$. If $\phi$ is 0 degree, i.e. the two drive signals are identical or in phase, respectively, the magnitude of the electric field is 0.0 V/mm. If the phase angle $\phi$ is 90 degrees, the magnitude of sin (45) is 0.707, and then the magnitude of electric field is 1.414 (A/d) Volt/mm. When the phase angle $\phi$ is 180 degrees, the magnitude of the electric filed has its maximum value of 2*(A/d) Volt/mm.

The phase difference $\phi$ regarding said two phase driving method can be used as a control parameter. Conventionally, the magnitude of the driving signal is changed in order to change the speed of a piezoelectric motor. As an alternative method to said conventional method, it is proposed to change motor speed by altering the phase angle between the two driving signals.

The specific geometry, namely the specific aspect ratios, of the inventive actuator has an additional advantage. Mechanical stresses distributed through the volume of the actuator when operated in its resonance mode are less than with the existing actuator structures or geometries. Therefore, the inventive actuator is more reliably in terms of crack generation occurred by stress related fatigues. As a consequence, the actuator has larger mechanical strength capacity such that the inventive actuator can be driven at higher electric fields in order to obtain higher velocities.

Figure 10:
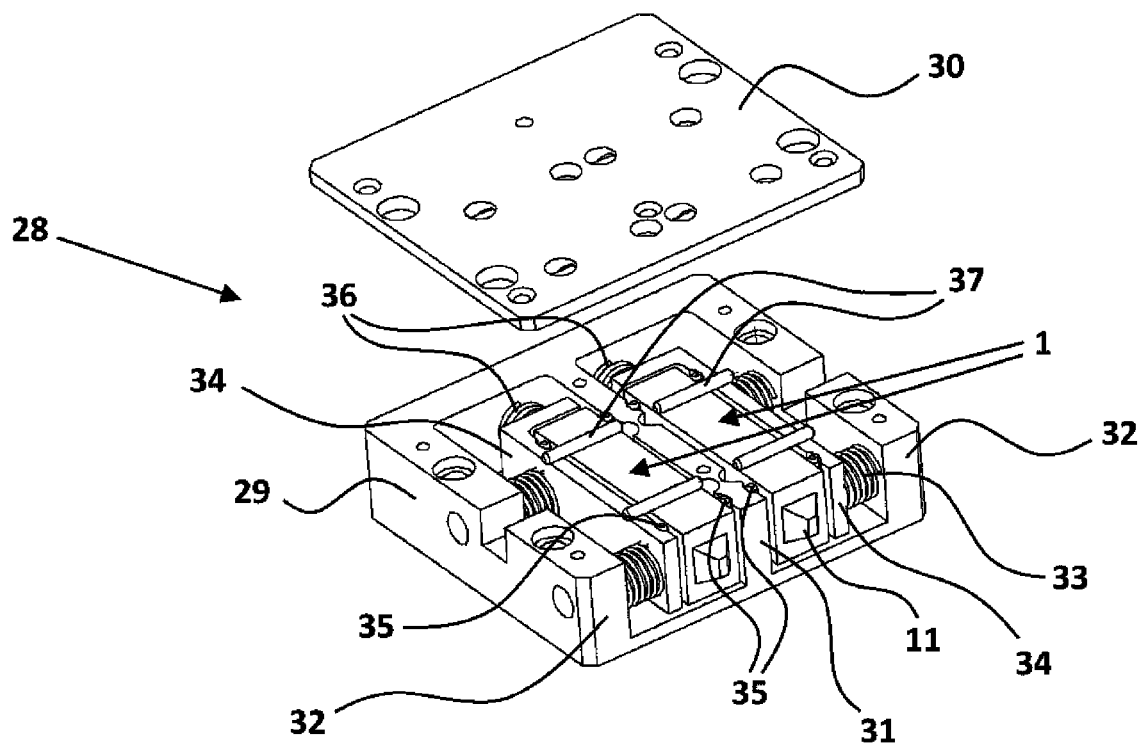

FIG. 10 shows a linear drive or linear motor 28 containing two identical actuators 1 according to the invention. The actuators 1 are placed in a case comprising a base part 29 and a cover part 30. The base part 29 has a central web portion 31 and two distal web portions 32. Between the central web portion and each of the distal web portions 32, an actuator 1 is arranged, where the actuator is pressed against the central web portion 31 with a specific force by spring elements 33 that on the other hand allow the bending vibrations of the actuators.

The spring elements 33 are supported by the distal web portions 32 and are—with their respective other end—in contact with a frame element 34. The actuator is movably supported by roller elements 35 where the roller elements 35 themselves are supported by the frame element 34 and by the central web portion 31. The roller elements 35 allow the change in dimension (i.e. in length direction) of the actuator due to its operation at the first longitudinal resonance mode where both ends of the actuator move in opposite directions. The rollers 35 are in contact with the flat main surfaces of the actuator, and are supported and hold in position by corresponding groove sections of the frame element 34 and of the central web portion 31.

Further spring elements 36 push the frame elements 34 and the actuators 1 arranged in the frame elements against the element to be driven by the actuators (which is not shown in FIG. 10). In order to allow the frame elements 34 and the actuators 1 to move in (or against) the pushing direction, the actuators 1 are movably supported by further roller elements 37 that are in contact with the longer side surfaces of the actuators. Said roller elements 37 are supported and hold in position by corresponding groove sections of the base part 29 and of the cover part 30.

Figure 11:
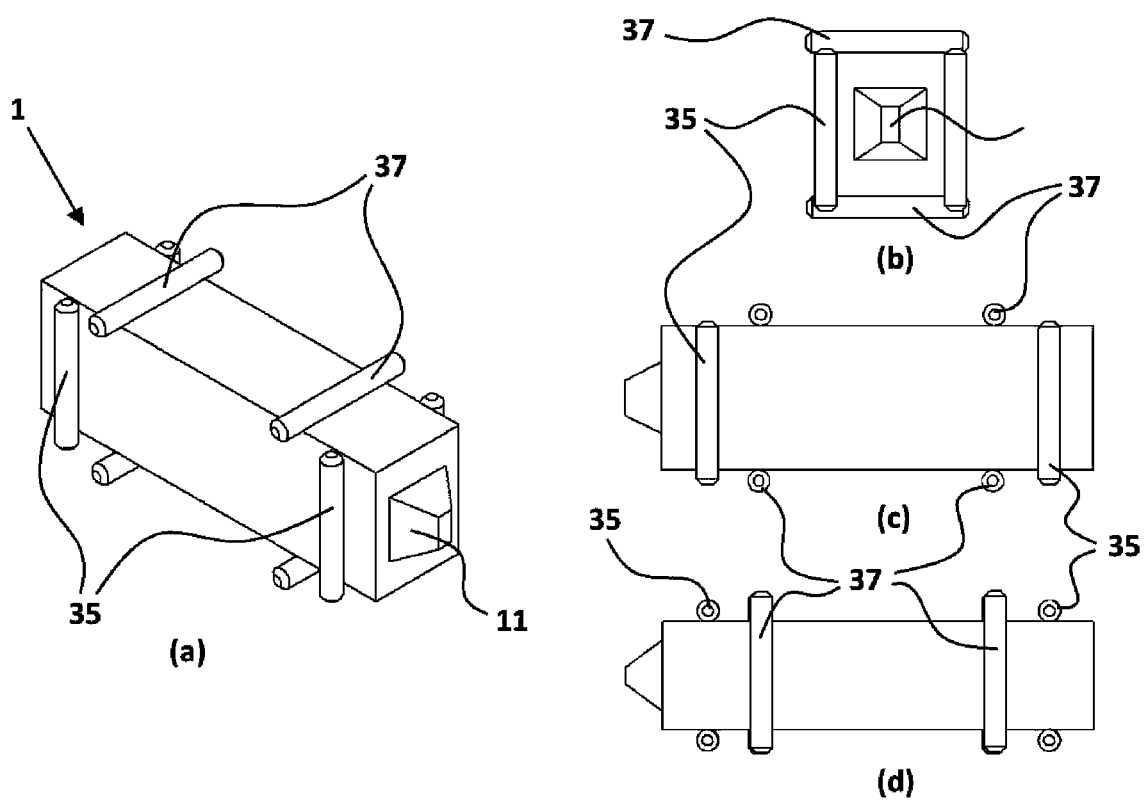

FIG. 11 shows the arrangement or position of the roller elements 35 and 37 with respect to the actuator of the motor according to FIG. 10 with the actuator and the rollers separated from the case of the motor for clarity reasons.

The invention claimed is:

1. An actuator with a rectangular shape comprises:
   polarized electromechanical material having two large main surfaces and four side surfaces connecting the two large main surfaces with each other, two of said four side surfaces representing long side surfaces being longer than the other two side surfaces representing short side surfaces;
   at least one friction element arranged on at least one of the short side surfaces, the actuator having a length L, a thickness T and a width W; and
   at least two active electrodes arranged on one of the two large main surfaces, and one common electrode arranged on the other of the two large main surfaces, with the at least two active electrodes arranged on the two large main surfaces defining outer electrodes, where the polarized electromechanical material of the actuator is polarized in its thickness direction and excitable to perform standing wave deformations due to an electric field generated therein upon application of an electric voltage to the at least two active electrodes, said deformations leading to a corresponding movement of the at least one friction element, and said corresponding movement of the at least one friction element being usable to drive an element via friction contact between the at least one friction element and the element to be driven, wherein in an unexcited state of the actuator, an aspect ratio for the length L of the actuator to its thickness T is between 3.9 and 4.1 and an aspect ratio for the length L of the actuator to its width W is between 2 and 5, with said aspect ratios being suitable for excitation of a first standing wave causing a first longitudinal vibration mode in a length direction of the actuator and for excitation of a second standing wave causing a second bending mode in a thickness direction of the actuator, with a second bending mode vibration perturbing the first longitudinal vibration mode resulting in an elliptic trajectory of a movement of the at least one friction element, said elliptic trajectory being usable to drive an element along the thickness direction of the actuator.

2. The actuator according to claim 1, wherein at least one of the at least two active electrodes has a curved section.

3. The actuator according to claim 1, wherein the polarization direction of the polarized electromechanical material is uniform and independent from a position within the polarized electromechanical material.

4. The actuator according to claim 1, wherein the actuator is free of electrodes arranged inside the polarized electromechanical material of the actuator.

5. The actuator according to claim 1, wherein the actuator comprises: at least one electrode arranged inside the polarized electromechanical material of the actuator defining an inner electrode.

6. The actuator according to claim 5, wherein the actuator comprises: a multitude of inner electrodes stacked in the thickness direction of the actuator, with electrodes being adjacent to each other with respect to a stacking direction having a different size.

7. The actuator according to claim 5, wherein the outer electrodes are electrically connected to the at least one inner electrode via at least one side electrode arranged on a side surface of the actuator.

8. The actuator according to claim 1, wherein each of the outer electrodes is at least partially covered by a layer of an elastic material.

9. The actuator according to claim 8, wherein a length of at least one of the layers of the elastic material is larger than the actuator's length.

10. The actuator according to claim 1, in combination with a rotary motor.

11. The actuator according to claim 2, wherein the polarization direction of the polarized electromechanical material is uniform and independent from a position within the polarized electromechanical material.

12. The actuator according to claim 11, wherein the actuator is free of electrodes arranged inside the polarized electromechanical material of the actuator.

13. The actuator according to claim 12, wherein the actuator comprises: at least one electrode arranged inside the polarized electromechanical material of the actuator defining an inner electrode.

14. The actuator according to claim 13, wherein each of the outer electrodes is at least partially covered by a layer of an elastic material.

15. The actuator according to claim 14, wherein a length of at least one of the layers of the elastic material is larger than the actuator's length.

16. A method for driving an actuator having polarized electromechanical material having two large main surfaces and four side surfaces connecting the two large main surfaces with each other, two of said four side surfaces representing long side surfaces being longer than the other two side surfaces representing short side surfaces; at least one friction element arranged on at least one of the short side surfaces, the actuator having a length L, a thickness T and a width W; and at least two active electrodes arranged on one of the two large main surfaces, and one common electrode arranged on the other of the two large main surfaces, with the at least two active electrodes arranged on the two large main surfaces defining outer electrodes, where the polarized electromechanical material of the actuator is polarized in its thickness direction and excitable to perform standing wave deformations due to an electric field generated therein upon application of an electric voltage to the at least two active electrodes, wherein in an unexcited state of the actuator, an aspect ratio for the length L of the actuator to its thickness T is between 3.9 and 4.1 and an aspect ratio for the length L of the actuator to its width W is between 2 and 5, with said aspect ratios being suitable for excitation of a first standing wave causing a first longitudinal vibration mode in a length direction of the actuator and for excitation of a second standing wave causing a second bending mode in a thickness direction of the actuator, with a second bending mode vibration perturbing the first longitudinal mode resulting in an elliptic trajectory of a movement of the at least one friction element, said elliptic trajectory being usable to drive an element along the thickness direction of the actuator, the method comprising: exciting the first standing wave for causing the first longitudinal vibration mode in the length direction of the actuator; and exciting the second standing wave for causing the second bending mode in the thickness direction of the actuator, with the second bending mode vibration perturbing the first longitudinal vibration mode resulting in the elliptic trajectory of the movement of the at least one friction element, wherein only one of the at least two active electrodes is applied with the electric voltage, while the other active electrode is floating.

17. The method according to claim 16, comprising: applying the common electrode with an electric voltage that is equal to the electric voltage applied to the only one of the at least two active electrodes but having a different polarity.

18. The method according to claim 17, comprising: applying the electric voltage to the only one of the at least two active electrodes by shifting its phase to the phase of the electric voltage applied to the common electrode, with a phase difference being a control parameter to control the electric field in the excited sections of the actuator.

* * * * *